(12) United States Patent
Benedict et al.

(10) Patent No.: US 10,771,291 B2
(45) Date of Patent: Sep. 8, 2020

(54) COMMUNICATION CHANNEL WITH TUNING STRUCTURE

(71) Applicant: Hewlett Packard Enterprise Development LP, Houston, TX (US)

(72) Inventors: Melvin Benedict, Houston, TX (US); Karl J. Bois, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/071,175

(22) PCT Filed: Jan. 29, 2016

(86) PCT No.: PCT/US2016/015555
§ 371 (c)(1),
(2) Date: Jul. 19, 2018

(87) PCT Pub. No.: WO2017/131727
PCT Pub. Date: Aug. 3, 2017

(65) Prior Publication Data
US 2019/0238370 A1    Aug. 1, 2019

(51) Int. Cl.
*H04L 25/03* (2006.01)
*H05K 1/02* (2006.01)
*H01P 1/203* (2006.01)
*H05K 1/11* (2006.01)
*H05K 3/40* (2006.01)

(52) U.S. Cl.
CPC .... *H04L 25/03159* (2013.01); *H01P 1/20363* (2013.01); *H05K 1/0246* (2013.01); *H05K 1/0251* (2013.01); *H05K 1/0253* (2013.01); *H05K 1/115* (2013.01); *H05K 3/4038* (2013.01); *H01P 1/203* (2013.01)

(58) Field of Classification Search
CPC ............ H04L 25/03159; H05K 1/0251; H05K 3/4038; H05K 1/115; H05K 1/0246; H01P 1/203
See application file for complete search history.

(56) References Cited

U.S. PATENT DOCUMENTS 6,597,062 B1     7/2003   Li et al.
7,330,090 B2 *   2/2008   Itoh ......................... H01P 7/082
                                                                  333/219
(Continued)

FOREIGN PATENT DOCUMENTS

WO    WO-2008054108 A1    5/2008

OTHER PUBLICATIONS

Dudnikov, G., et al., "Matched Terminated Stub VTA Technology for Higher Bandwidth transmission in Linc Cards and Back Planes," white paper, 2008, www.sanmina-sci.com. (Year: 2008).*

(Continued)

*Primary Examiner* — Nader Bolourchi
(74) *Attorney, Agent, or Firm* — Park, Vaughan, Fleming & Dowler LLP

(57) ABSTRACT

An example system includes a communication channel and at least one tuning structure coupled to the communication channel. The tuning structure includes a branch of the communication channel. The tuning structure is to dissipate energy from the communication channel at least at one selected wavelength. The branch of the communication channel is a terminated portion.

18 Claims, 3 Drawing Sheets

(56) References Cited

U.S. PATENT DOCUMENTS

| | | |
|---|---|---|
| 2006/0273863 A1 | 12/2006 | Quan et al. |
| 2010/0039193 A1* | 2/2010 | Ryou ................. H01P 3/081 |
| | | 333/219 |
| 2010/0052421 A1 | 3/2010 | Schindler et al. |
| 2010/0265011 A1 | 10/2010 | Ding et al. |
| 2011/0033007 A1* | 2/2011 | Zerbe ................ G06F 13/4086 |
| | | 375/295 |
| 2012/0206218 A1 | 8/2012 | Takahashi |
| 2014/0016686 A1 | 1/2014 | Ben Artsi |
| 2014/0258738 A1 | 9/2014 | Greenwalt et al. |
| 2015/0180107 A1 | 6/2015 | Ao et al. |
| 2015/0187507 A1* | 7/2015 | Miller ................ H01M 4/0402 |
| | | 361/500 |
| 2015/0223336 A1 | 8/2015 | Lee et al. |
| 2016/0170923 A1 | 6/2016 | Kutch et al. |
| 2016/0266637 A1 | 9/2016 | Butcher et al. |

OTHER PUBLICATIONS

Channel-limited High-speed Links: Modeling, Analysis and Design, http://chipgen.stanford.edu/people/alum/pdf/0409_Stojanovic_Link_Opt.pdf, pp. 1-180.

International Search Report and Written Opinion, International Patent Application No. PCT/US2016/015555, dated Jan. 29, 2016, pp. 1-10, KIPO.

W. Beyene et al., "Signal and power integrity analysis of a 256-GB/s double-sided IC package with a memory controller and 3D stacked DRAM," 2013 IEEE 63rd Electronic Components and Technology Conference, Las Vegas, NV, 2013, pp. 13-21.

* cited by examiner

COMMUNICATION CHANNEL WITH TUNING STRUCTURE

BACKGROUND

Electronic devices of various types include communication channels for transmitting information between various components. Such communication channels may be used to transmit electronic signals to and from components such as drivers, receivers, routers or the like. In some examples, the communication channels may form communication busses, such as a memory bus, for example.

BRIEF DESCRIPTION OF THE DRAWINGS

For a more complete understanding of various examples, reference is now made to the following description taken in connection with the accompanying drawings in which.

DETAILED DESCRIPTION

Various examples described herein provide communication channels with tuning structures to selectively reduce or dissipate energy from a communication signal or pulse. In various example, communication channels are provided with tuning structures that are tuned to reduce energy for signals at particular wavelengths, or frequencies. Such reduction or dissipation of energy can reduce the energy that may be reflected within the channel, causing interference, such as inter-symbol interference (ISI), or other problems.

Figure 1:
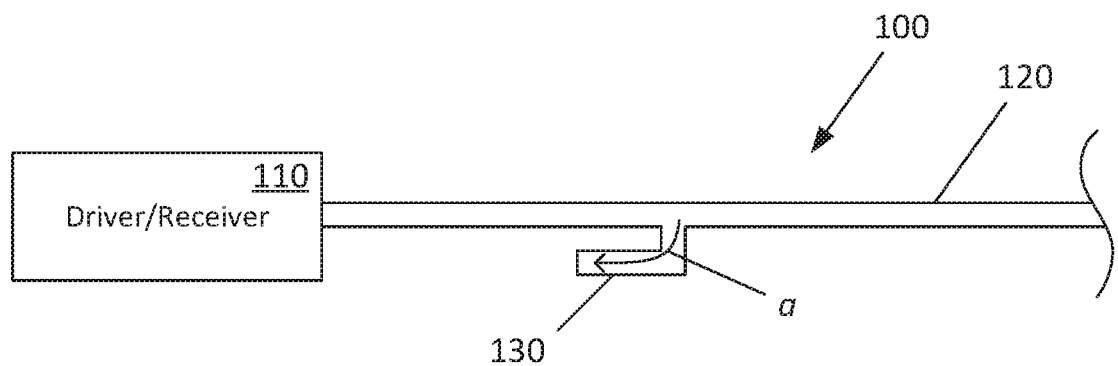
FIG. 1 illustrates an example system with a communication channel and an example tuning structure.

Referring now to the figures, FIG. 1 illustrates an example system with a communication channel and an example tuning structure. The example system 100 may be implemented in a variety of environments, such as a computer system or a smart phone, for example. The example system 100 includes an electronic component 110 which may facilitate communication. For example, the electronic component 110 may be a driver for amplification of a signal or a receiver to receive and/or process a signal. In other examples, the electronic component may be a transmitter or any of a variety of other components.

As illustrated in FIG. 1, the example system 100 includes a communication channel 120 coupled to the electronic component. In various examples, the communication channel 120 may be an electronic trace formed on, for example, a substrate or a printed circuit board (PCB). The communication channel 120 of the example system 100 may carry signals to and/or from the electronic component 110. In one example, the communication channel 120 is a memory bus for carrying signals to and from, for example, a memory controller or a memory device.

Communication channels, such as the communication channel 120 of the example system 100, can experience problems such as interference (e.g., inter-symbol interference (ISI)). For example, ISI may result from signal reflections at points of impedance mismatch along the communication channel. Reflections are particularly troublesome in, for example, memory busses with higher speeds and/or short lengths. In such cases, leading edge energy of a signal transmitted through the communication channel can result in significant reflection issues at an electronic component at the receiving end, for example.

Various examples described herein may serve to reduce reflection and thereby reduce interference issues. Referring again to FIG. 1, the example system 100 is provided with an example tuning structure 130 coupled to the communication channel 120. The example tuning structure 130 includes a portion that is a branch of the communication channel 120. The branch may be electronically parallel to the communication channel. As used herein, electronically parallel refers to a portion that may be a portion of a circuit that is parallel with a load and may be an open circuit, a short circuit, form a capacitor or an inductor to ground. In one example of FIG. 1, the example tuning structure 130 may also be physically parallel to the communication channel 120. In various examples, the electronically parallel portion of the communication channel 120 is a terminated portion (e.g., an open circuit). In this regard, one end of the example tuning structure 130 of the example system 100 is coupled to the communication channel 120, while the other end is unconnected and terminates.

The example tuning structure 130 may be tuned to dissipate energy from the communication channel at least at one selected wavelength. In the example of FIG. 1, the example tuning structure 130 is tuned to dissipate energy from the communication channel at a single wavelength λ. In this regard, the electrical length a of the tuning structure 130 (as indicated by the arrow) is approximately ¼ of the wavelength for which energy is to be dissipated (λ/4).

Thus, the example tuning structure 130 of the example system 100 of FIG. 1 reduces the energy of the selected wavelength in the communication channel 120. Reducing the energy results in a reduction or elimination of reflection of the energy back into the communication channel.

Figure 2:
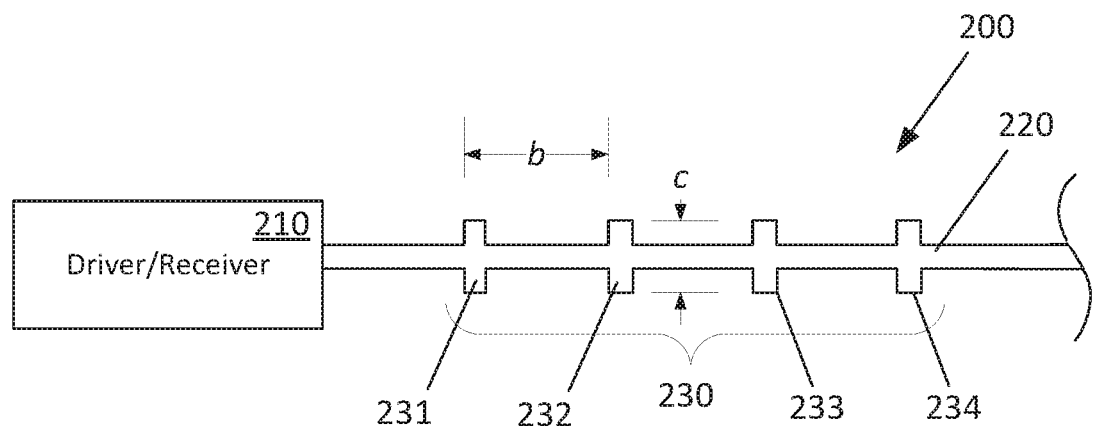
FIG. 2 illustrates an example system with an example tuning structure for robust tuning.

Referring now to FIG. 2, another example system 200 with a communication channel and an example tuning structure is illustrated. The example system 200 is similar to the example system 100 of FIG. 1 and includes an electronic component 210 and a communication channel 220 coupled to the electronic component 210. The example system 200 is provided with an example tuning structure 230 coupled to the communication channel 220. The example tuning structure 230 of FIG. 2 includes a series of protrusions 231-234 extending from the communication channel 220. Thus, the series of protrusions 231-234 of the example tuning structure 230 form electronically parallel portions that are terminated.

The series of protrusions 232 are separated by an electrical length b of the communication channel 220. In one example, the example tuning structure 230 is tuned to dissipate energy from the communication channel at a selected wavelength. In this regard, the electrical length b of the separation between the series of protrusions 231-234 is approximately ¼ of the wavelength for which energy is to be dissipated (λ/4). The number of protrusions 231-234 and the size of each protrusion 231-234 may be indicative of the amount of energy to be dissipated and the bandwidth of the energy dissipation. For example, variations in the physical dimensions of the protrusions 231-234, as well as variations in the separation (b) between the series of protrusions 231-234 may provide a broader bandwidth of energy dissipation in a manner similar to a band-stop filter. While FIG. 2 illustrates the example tuning structure 230 with four protrusions 231-234, various examples may include fewer or greater number of protrusions 231-234. A larger number of protrusions 231-234 may provide a more robust filtering of the energy, but the number may be limited by the length of the communication channel 220. Similarly, a larger length c of each protrusion 231-234 may provide an increased reduction in the energy, but the size of each protrusion 231-234 may be limited by the amount of space available on, for example, the substrate or the PCB on which the communication channel 220 is formed.

Figure 3:
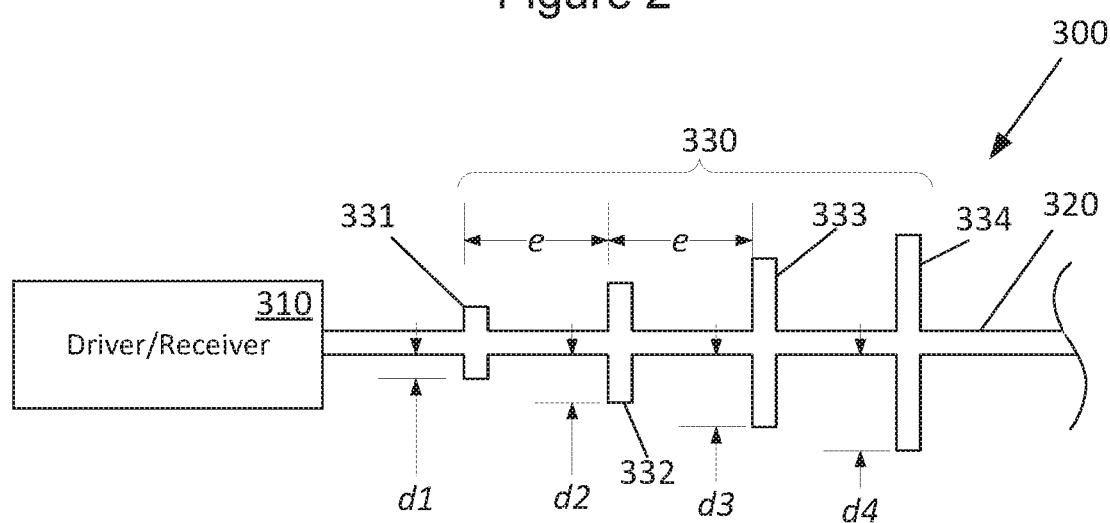
FIG. 3 illustrates an example system with an example tuning structure for broadband tuning.

Referring now to FIG. 3, another example system 300 with a communication channel and an example tuning structure is illustrated. The example system 300 is similar to the example system 100 of FIG. 1 and the example system 200 of FIG. 2. Thus, the example system 300 of FIG. 3 includes an electronic component 310 and a communication channel 320 coupled to the electronic component 310. The example system 300 is provided with an example tuning structure 330 coupled to the communication channel 320. The example tuning structure 330 of FIG. 3 may provide filtering of the energy at multiple wavelengths. In this regard, the example tuning structure 330 includes a series of protrusions 331-334 extending from the communication channel 320, each protrusion in the series of protrusions 331-334 having a different electrical length d1-d4, respectively.

Each protrusion 331-334 may be tuned to dissipate energy at a different wavelength. In this regard, each protrusion 331-334 has a length d1-d4 that is approximately ¼ of a corresponding wavelength for which energy is to be dissipated. For example, the first protrusion 331 has a length d1 which may be approximately ¼ of corresponding wavelength $\lambda_1$ (d1=$\lambda_1$/4). Similarly, the second protrusion 332 has a length d2 which may be approximately ¼ of corresponding wavelength $\lambda_2$ (d2=$\lambda_2$/4), the third protrusion 333 has a length d3 which may be approximately ¼ of corresponding wavelength $\lambda_3$ (d3=$\lambda_3$/4), and the fourth protrusion 334 has a length d4 which may be approximately ¼ of corresponding wavelength $\lambda_4$ (d4=$\lambda_4$/4).

The series of protrusions 331-334 are separated by an electrical length e of the communication channel 320. In one example, the separation of the protrusions 331-334 corresponds to the electrical length of the fundamental frequency of the example system 300. While FIG. 3 illustrates the example tuning structure 330 with four protrusions 331-334, the number of protrusions 331-334 may correspond to the number of frequencies for which energy is to be dissipated. In some examples, the protrusions 331-334 may be non-equally spaced. Thus, the spacing e between the different pairs of protrusions 331-334 may vary, thus providing variation in the wavelength filtered and providing a broader bandwidth of filtration.

Figure 4:
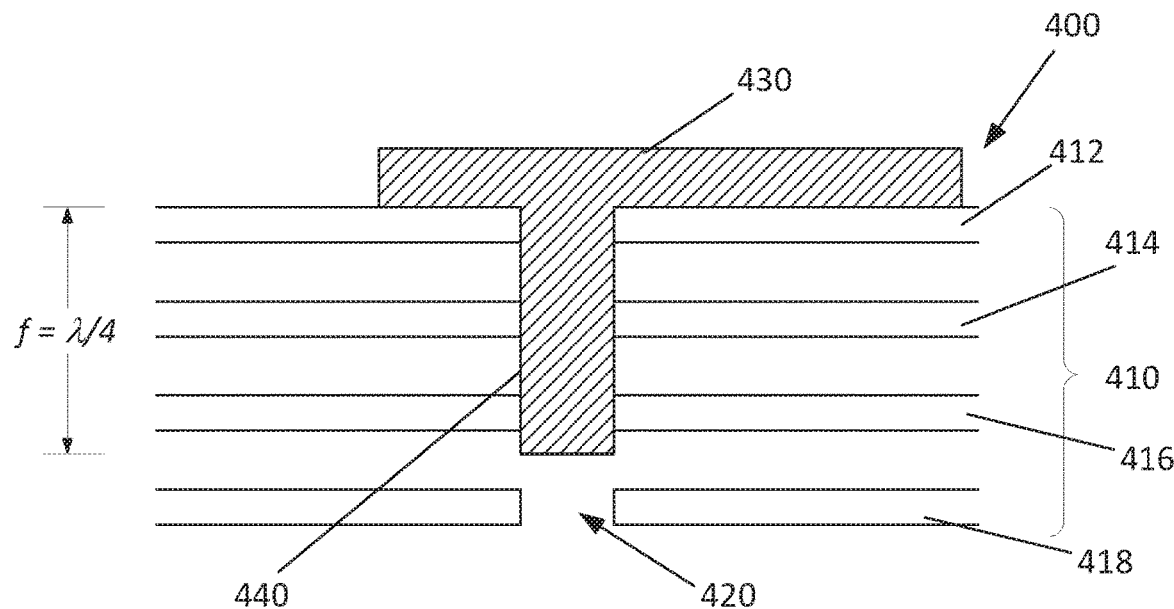
FIG. 4 illustrates an example system with an example tuning structure formed with a via.

Referring now to FIG. 4, another example system 400 with a communication channel and an example tuning structure formed on a circuit board stack is illustrated. FIG. 4 is a cross-section view of the system 400 and illustrates a communication channel 430 extending into and out of the page. The example system 400 of FIG. 4 includes a stack 410 of layers of PCB's 412-418. The stack 410 includes a via 420 formed through the layers of PCB's 412-418. The via 420 may be circular via drilled through the stack 410, for example.

The communication channel 430 is formed on a first surface of the stack 410. As illustrated in FIG. 4, the communication channel 430 is formed on the top surface of the stack 410. As noted above, the communication channel 430 may be coupled to an electronic component (not shown in FIG. 4).

The example system 400 is provided with an example tuning structure 440 coupled to the communication channel 430. The example tuning structure 440 of FIG. 4 includes a stub extending from the communication channel 430 into the via 420. As with the example tuning structures described above, the stub of the tuning structure 440 of FIG. 4 forms an electronically parallel portion of the communication channel 430 that is terminated.

The example tuning structure 440 may be tuned to dissipate energy from the communication channel 430 at a selected wavelength. In this regard, the electrical length f of the tuning structure 440 is approximately ¼ of the wavelength for which energy is to be dissipated ($\lambda$/4).

Figure 5:
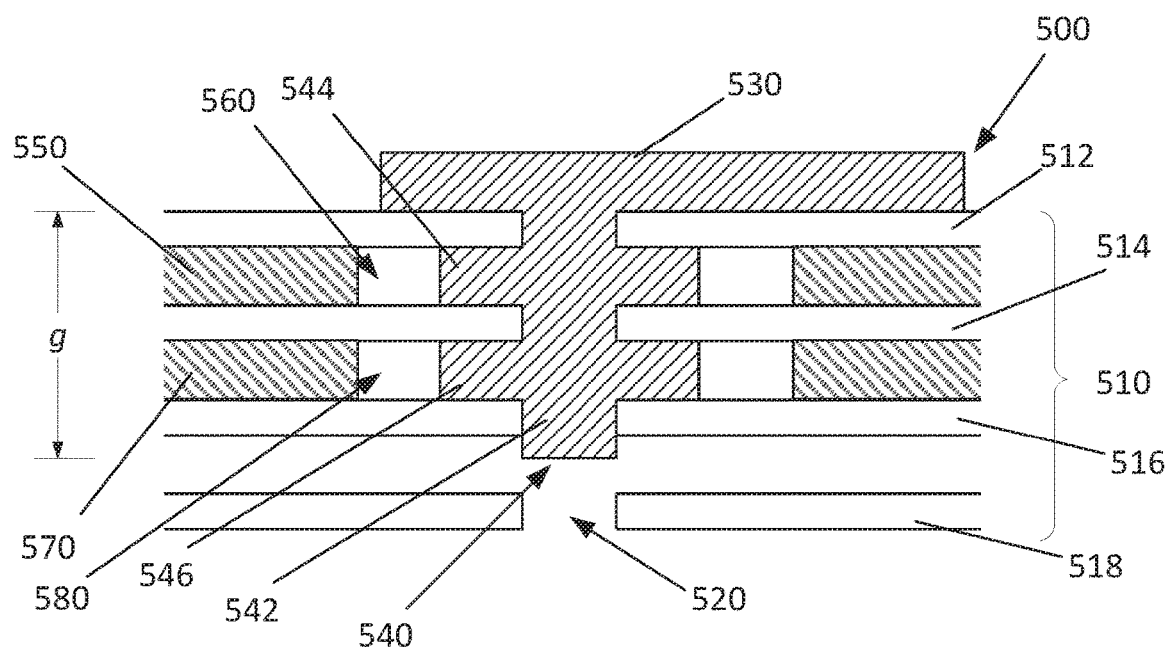
FIG. 5 illustrates an example system with an example tuning structure formed using capacitance coupling.

Referring now to FIG. 5, another example system 500 with a communication channel and an example tuning structure formed on a circuit board stack is illustrated. The example system 500 is similar to the example system 400 of FIG. 4 and includes a communication channel 530 extending into and out of the page and formed on a surface of a stack 510 of layers of PCB's 512-518. The stack 510 includes a via 520 formed through the layers of PCB's 512-518.

The example system 500 is provided with an example tuning structure 540 coupled to the communication channel 530. The example tuning structure 540 of FIG. 5 includes a stub 542 extending from the communication channel 530 into the via 520 in a manner similar to that described above with reference to FIG. 4. The example tuning structure 540 may be tuned to dissipate energy from the communication channel 530 at a selected wavelength. In this regard, the electrical length g of the tuning structure 540 is approximately ¼ of the wavelength for which energy is to be dissipated ($\lambda$/4).

In the example system 500 of FIG. 5, the tuning structure 540 includes protrusions extending from the stub 542 into a region between the layers of PCB's 512-518. For example, as illustrated in FIG. 5, the tuning structure 540 includes protrusions 544 extending from the stub 542 into a region between PCB layers 512 and 514. The tuning structure 540 further includes protrusions 546 extending from the stub 542 into a region between PCB layers 514 and 516.

The protrusions 544, 546 form voids 560, 580 with terminals 550, 570 extending into the regions between the PCB layers 512-518. In one example, the terminals 550, 570 may be ground voltage ($V_{ss}$) terminals and supply voltage ($V_{dd}$) terminals. Thus, the void 560 formed by protrusion 544 and terminal 550 and the void 580 formed by the protrusion 546 and the terminal 570 may be capacitive voids which provide further dissipation of energy from the communication channel 530 at the selected wavelength.

Figure 6:
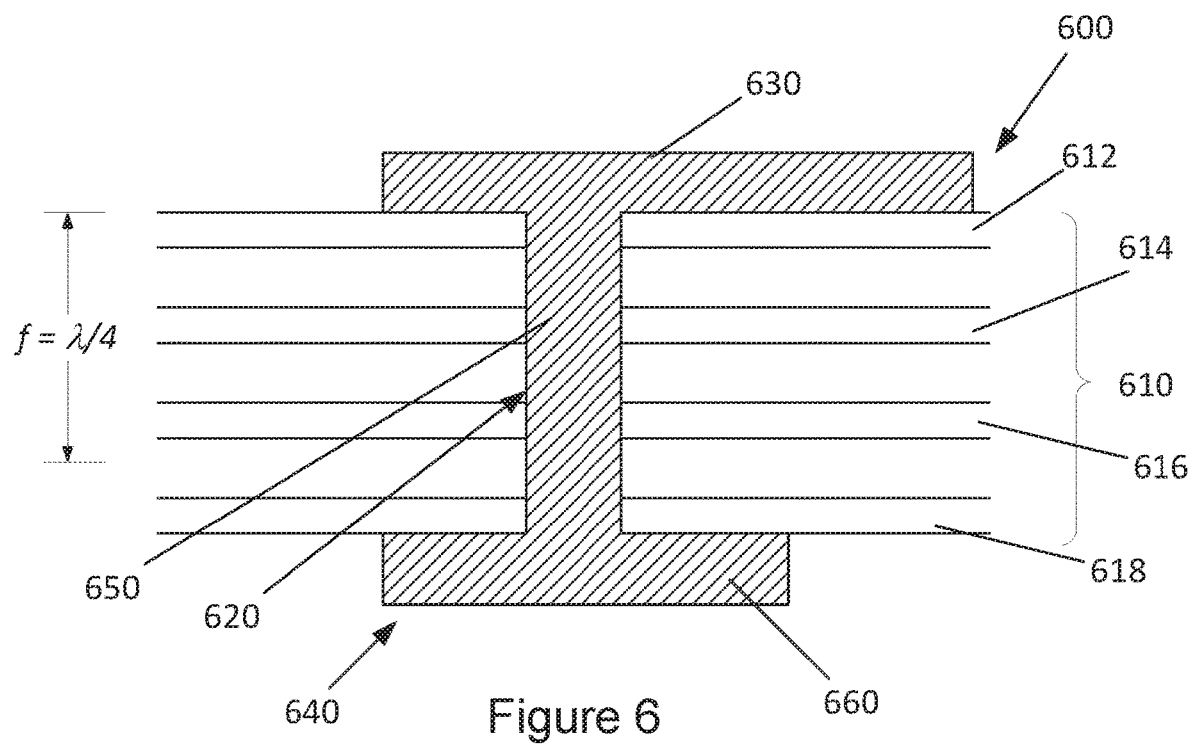
FIG. 6 illustrates an example system with another example tuning structure.

Referring now to FIG. 6, another example system 600 with a communication channel and an example tuning structure formed on a circuit board stack is illustrated. The example system 600 is similar to the example system 400 of FIG. 4 and the example system 500 of FIG. 5. Thus, the example system 600 of FIG. 6 includes a communication channel 630 extending into and out of the page and formed on a surface of a stack 610 of layers of PCB's 612-618. The stack 610 includes a via 620 formed through the layers of PCB's 612-618.

The example system 600 is provided with an example tuning structure 640 coupled to the communication channel 630. The example tuning structure 640 of FIG. 6 includes a stub portion 650 extending from the communication channel 630 into the via 620 in a manner similar to that described above with reference to FIGS. 4 and 5.

In the example system 600 of FIG. 6, the tuning structure 640 includes a stub portion 650 that extends completely through the via 620 and is coupled to a trace extension portion 660 formed on a second surface (bottom surface in FIG. 6) of the stack 610. In various examples, the trace portion 660 is sized to tune the tuning structure 640 for a selected wavelength. In some examples, the trace portion 660 may be a single dot in the region of the via 620. In other examples, the trace portion 660 may be an elongated trace formed on the second surface of the stack 610.

Figure 7:
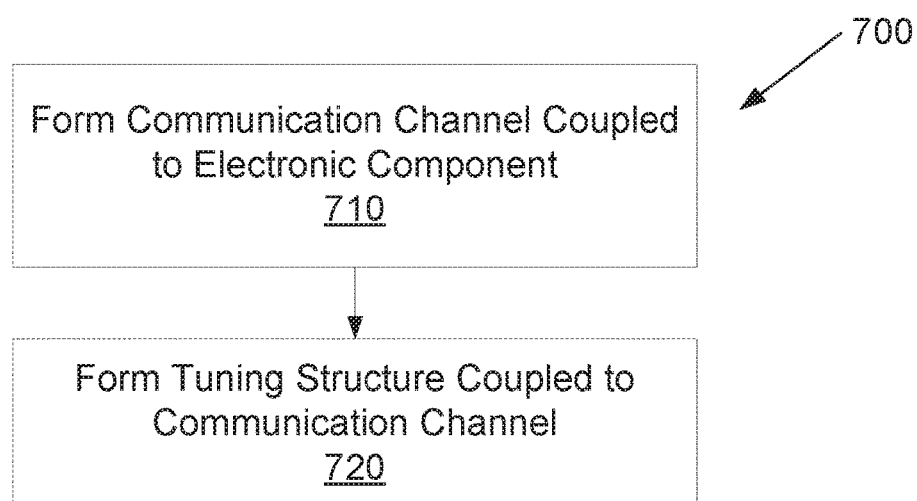
FIG. 7 illustrates an example method for forming an example communication channel.

Referring now to FIG. 7, a flowchart illustrates an example method for forming an example communication channel. In the example method 700, a communication channel is formed coupled to an electronic component (block 710). As noted above, the communication channel may be formed on, for example, a substrate or a PCB (or a PCB stack). The communication channel may be to carry an electronic signal. A tuning structure is formed coupled to the communication channel (block 720). As described above, the tuning structure may include an electronically parallel portion of the communication channel and may be tuned to dissipate energy from the communication channel at least at one selected wavelength. The electronically parallel portion may be a terminated portion.

Thus, in accordance with various examples described herein, communication channels are provided with tuning structures to selectively reduce or dissipate energy from a communication signal or pulse. The tuning structures may be tuned to reduce energy for signals at particular wavelengths and can, therefore, reduce the energy that may be reflected within the channel.

The foregoing description of various examples has been presented for purposes of illustration and description. The foregoing description is not intended to be exhaustive or limiting to the examples disclosed, and modifications and variations are possible in light of the above teachings or may be acquired from practice of various examples. The examples discussed herein were chosen and described in order to explain the principles and the nature of various examples of the present disclosure and its practical application to enable one skilled in the art to utilize the present disclosure in various examples and with various modifications as are suited to the particular use contemplated. The features of the examples described herein may be combined in all possible combinations of methods, apparatus, modules, systems, and computer program products.

It is also noted herein that while the above describes examples, these descriptions should not be viewed in a limiting sense. Rather, there are several variations and modifications which may be made without departing from the scope as defined in the appended claims.

What is claimed is:

1. A system, comprising:
a communication channel; and
at least one tuning structure physically coupled to the communication channel, the tuning structure including:
a stub extending from the communication channel; and
a first protrusion extending from the stub or from the communication channel,
wherein the stub and the first protrusion being coupled to the communication channel in one end and is unconnected and terminates in another end and being tuned to dissipate energy from the communication channel at least at one selected wavelength.

2. The system of claim 1, wherein the stub or the first protrusion extending from the communication channel has an electrical length of ¼ of the selected wavelength.

3. The system of claim 1, wherein the tuning structure includes two or more protrusions along the length of the communication channel, the two or more protrusions being separated by a distance of ¼ of the selected wavelength.

4. The system of claim 1, wherein the tuning structure is tuned to dissipate energy from the communication channel at least at two selected wavelengths, wherein the tuning structure includes two or more protrusions along the length of the communication channel, each of the two or more protrusions having a length of ¼ of a corresponding wavelength of the at least two selected wavelengths.

5. The system of claim 4, wherein the two or more protrusions are separated by an electrical distance corresponding to a fundamental frequency.

6. A system, comprising:
a circuit board stack having a via formed therethrough;
a communication channel formed on a first surface of the circuit board stack; and
a tuning structure physically coupled to the communication channel, the tuning structure including:
a stub extending from the communication channel at least partially through the via; and
a first protrusion extending from the stub or from the communication channel, wherein the stub and the first protrusion being coupled to the communication channel in one end and is unconnected and terminates in another end and tuned to dissipate energy from the communication channel at least at one selected wavelength.

7. The system of claim 6, wherein the stub or the first protrusion extending from the communication channel has an electrical length of ¼ of the selected wavelength.

8. The system of claim 6, where the tuning structure further includes protrusions extending from the stub into a region between layers of the circuit board stack.

9. The system of claim 8, wherein the protrusions extending from the stub form a capacitive void with at least one of ground voltage terminals or supply voltage terminals.

10. The system of claim 6, wherein the stub extends through the entire via and is coupled to a trace extension portion formed on a second surface of the circuit board stack.

11. A method, comprising:
forming a communication channel coupled to an electronic component, the communication channel being to carry an electronic signal; and
forming at least one tuning structure physically coupled to the communication channel, the tuning structure including:
a stub extending from the communication channel; and
a first protrusion extending from the stub or from the communication channel, and
wherein the stub and the first protrusion being coupled to the communication channel in one end and is unconnected and terminates in another end and being tuned to dissipate energy from the communication channel at least at one selected wavelength.

12. The method of claim 11, wherein the stub or the first protrusion extending from the communication channel has an electrical length of ¼ of the selected wavelength.

13. The method of claim 11, wherein the tuning structure includes two or more protrusions along the length of the communication channel, the two or more protrusions being separated by a distance of ¼ of the selected wavelength.

14. The method of claim 11, wherein the tuning structure is tuned to dissipate energy from the communication channel at least at two selected wavelengths, wherein the tuning structure includes two or more protrusions along the length of the communication channel, each of the two or more protrusions having a length of ¼ of a corresponding wavelength of the at least two selected wavelengths.

15. The method of claim 14, wherein the two or more protrusions are separated by a distance of an electrical distance corresponding to a fundamental frequency.

16. The system of claim 1, wherein the tuning structure includes a plurality of protrusions extending from the stub into a region between layers of a circuit board stack.

17. The system of claim 1, wherein the stub extends at least partially through a via formed in a printed circuit board stack.

18. The method of claim 11, wherein the stub extends at least partially through a via formed in a printed circuit board stack.

* * * * *